United States Patent [19]

Kovalcik et al.

[11] Patent Number: 5,220,207
[45] Date of Patent: Jun. 15, 1993

[54] LOAD CURRENT MONITOR FOR MOS DRIVER

[75] Inventors: Thomas J. Kovalcik, Barrington; Paul W. Latham, II, Durham, both of N.H.

[73] Assignee: Allegro Microsystems, Inc., Worcester, Mass.

[21] Appl. No.: 753,475

[22] Filed: Sep. 3, 1991

[51] Int. Cl.⁵ .................. H03K 5/153; H03K 5/22; H03K 17/60
[52] U.S. Cl. ..................... 307/350; 307/570; 307/491; 307/355
[58] Field of Search ............. 307/570, 571, 350, 491, 307/304, 497, 577, 584

[56] References Cited

U.S. PATENT DOCUMENTS

| | | | |
|---|---|---|---|
| 4,251,743 | 2/1981 | Hareyama | 307/254 |
| 4,427,903 | 1/1984 | Sugimoto | 307/355 |
| 4,675,561 | 6/1987 | Bowers | 307/304 |
| 4,948,992 | 8/1990 | Bukowski | 307/491 |
| 4,965,469 | 10/1990 | Kondoh et al. | 307/570 |
| 5,006,731 | 4/1991 | Denda | 307/570 |
| 5,057,719 | 10/1991 | Niedra | 307/570 |
| 5,081,379 | 1/1992 | Korteling | 307/355 |

OTHER PUBLICATIONS

S. Clemente et al "An Introduction to the HEXSense Current-Sensing Device" International Rectifier Data Book, 4th Edition, 1987–pp. I-151-I-156.

Primary Examiner—William L. Sikes
Assistant Examiner—Toan Tran

[57] ABSTRACT

An integrated circuit chip includes a MOS driver transistor and a relatively small MOS current-monitor transistor having their sources connected to a circuit ground point and their gates connected together to a control-voltage conductor. Current through the monitor transistor flows to a DC voltage supply conductor through a field effect transistor. A differential amplifier has one input connected to the drain of the driver transistor and the other input connected to the drain of the monitor transistor. The output of the differential amplifier is connected to the gate of the field effect transistor to force the drain voltage of the monitor transistor to be equal to the drain voltage of the driver transistor. The current flowing through the small monitor transistor has a constant proportionality with the load current even as the load current approaches zero. With the addition of a differential voltage amplifier having an output connected to the control-voltage conductor, having one input connected to a circuit ground point, and the other input connected to a control-current input pad, the current from the monitor transistor is fedback via a current mirror circuit to the other input of the voltage amplifier, so that the entire circuit can be made to perform as a current amplifier, e.g. driver-load-current/input-control current. By connecting one end of an external precision resistor to the control-current-input pad of the chip and applying a control voltage to the opposite end of the precision resistor, a control current proportional to the control voltage is caused to flow through the control-circuit-input pad. The combination performs as a current amplifier.

8 Claims, 2 Drawing Sheets

LOAD CURRENT MONITOR FOR MOS DRIVER

BACKGROUND OF THE INVENTION

This invention relates to a load-current monitor circuit for a MOS power transistor and more particularly to such a circuit in which the gate and the source respectively of a small MOS monitor transistor are connected to the gate and source of the power transistor.

Load-current monitor circuits for a MOS power transistor in the prior art typically have the circuit configuration shown in FIG. 1. A large area MOS power or driver transistor 10 is connected in series with the load 12 forming a circuit branch that is connected between a voltage supply terminal 14 and a circuit ground point 15. A much smaller area MOS monitor transistor 18, having been made simultaneously and by the same process steps used for making the large driver transistor 10 has identical characteristics, e.g. the same channel-polarity and the same threshold voltage, as does the driver transistor 10. The large high current MOS driver transistor 10 is usually made up of an array of smaller elemental transistors. The small MOS transistor 18, hereinafter referred to as a monitor transistor, is usually made up using only one or two such small but additional elemental transistors.

The drains of the driver transistor 10 and the monitor transistor 18 are connected to the voltage supply terminal 14 and the gates of the driver and monitor transistors are both connected to the driver input terminal, namely the driver control-voltage terminal 20. Current Im through the monitor transistor 18 flows to ground through a MOS transistor and an NPN transistor 24. A differential amplifier 26 has one input connected to the source of the driver transistor 10 and the other input connected to the source of the monitor transistor 18. The output of the amplifier 26 is connected to the gate of the transistor 22 for forcing the source voltage Vms of the monitor transistor 18 to be more nearly equal to the source voltage Vds of the driver transistor 10. Since the characteristics of the driver and monitor transistors are the same, when the sources of the driver and monitor transistor are indeed equal, the relatively small monitor current Im is proportional to the load current flowing through the driver transistor 10. When these conditions are realized in practice, the current ratio Id/Im is essentially exactly equal to the ratio of the area of the driver transistor 10 to the area of the monitor transistor 18. The monitor output current Iout from the collector of the current mirror transistor 28 would consequently be proportional to the load current.

This circuit provides an output current Iout that tracks the load current Im rather well, for high values of load current. However, the lower the load current becomes, the poorer that tracking becomes, and in fact when the load current approaches zero, the monitor output current may be quite poorly or even unrecognizably related to the load current.

Circuits of this kind are often employed as a current regulator by feeding back the monitor output current to the driver control input. Regulation will then be good only at relatively high currents.

For some applications, accuracy at low driver current levels is also required. For example, servo motors typically operate most of the time at slow speeds. Thus tracking accuracy between monitor current and driver load current at low motor drive currents is particularly important if not critical in a servo application.

It is an object of this invention to provide a driver load current monitor that overcomes the aforementioned shortcomings of prior art.

It is a further object of this invention to provide a driver load current monitor wherein the monitor output current is proportional to the driver load current down to near zero current levels.

It is yet another object of this invention to provide such a driver load current monitor wherein the monitor output current is essentially zero when the driver load current is zero.

SUMMARY OF THE INVENTION

A load-current monitor circuit for a MOS driver transistor includes a large MOS driver transistor and a relatively small MOS monitor transistor having the same channel polarity and the same threshold voltage, preferably there having been formed simultaneously in the same semiconductor integrated circuit chip for the same reasons described above for the corresponding prior art driver and monitor transistors. The sources of the MOS driver and monitor transistors are connected together and then to a first pair of energizing-voltage supply terminals. The gates of the driver and monitor transistors are connected together and to a driver control-voltage-signal conductor. The circuit additionally includes a voltage-forcing means having an input connected to the drain of the MOS driver transistor and having an output connected to the drain of the MOS monitor transistor, for forcing the drain voltage of the monitor transistor to be equal to the drain voltage of the driver transistor.

By forcing the drains voltages to be equal, the MOS monitor and driver transistors always have the same bias point. The ratio of the driver (load) current to the monitor transistor current will be essentially equal to the respective areas of the MOS driver and monitor transistor structures even for driver currents approaching zero. Thus when the driver current is zero, the monitor current is also essentially zero.

In the load-current monitor circuit of the prior art, the driver and monitor transistors have their drains connected together and to a voltage supply circuit point, and deals separately with the currents through the two respective sources. The load-current monitor circuit of this invention deals separately with the load and monitor currents through the two respective drains. The drain impedance is typically much larger than the source impedance in a MOS transistor. In particular, when the MOS transistors are in saturation, the drain impedance approaches a current source. At low currents, the MOS transistors in a power amplifier are in the saturation region.

This invention recognizes that in the prior art circuit, the feedback amplifier that controls the source of the small monitor transistor will inevitably include some unknown offset voltage, and further recognizes that the error caused by this offset is inversely proportional to the source impedance of the monitor transistor. In the circuit of this invention, offset in the feedback amplifier has essentially no effect on the ratio of monitor current to driver (load) current and this ratio is essentially unchanging from high load currents down to load currents approaching zero.

The driver load-current monitor circuit of this invention is preferably formed in a silicon integrated circuit chip and may additionally include a differential control-voltage amplifier having an output connected to the gate of the MOS driver transistor. The integrated circuit has an input-control current contact-pad connected to one input of the control-voltage amplifier. In one aspect of the invention, the other amplifier input is connected to the second voltage supply terminal, that may serve as the circuit ground point or simply may be connected to the more negative side to the supply voltage.

In another aspect of the invention, the integrated driver monitor circuit includes a current mirror circuit means having an output connected to the input-current control pad, and having an input connected to the monitor transistor drain for generating an output current proportional to the monitor and the driver load-current. Now, when an external resistor is connected between the input-control-current pad and the circuit ground point and a control current is forced into the input-control-current pad, the amplitude of the output current from the current mirror circuit means will change commensurately with changes in the input control current and has the polarity which keeps the voltage at the input control-current pad at very nearly zero. The integrated circuit chip portion of this circuit combined with its load can now be viewed as a current amplifier, i.e. with an input control current and a proportional output load current.

This integrated circuit requires no additional contact pads, and requires no integrated circuit resistors that influence amplifier gain, except those used that may be used in pairs to establish voltage ratios. Only the discrete external resistor at the input determines gain, and that discrete resistor may be a high-ohmic-value temperature-stable resistor chosen by the user with a resistance value most suitable for his application. Discrete high value resistors (e.g. 10,000 ohms) tend to be significantly less expensive and physically smaller than low value resistors. This integrated circuit is especially well suited for use as a "voice coil" servo (actuator) amplifier that actuates the voice-coil load in response to an input control current.

DESCRIPTION OF THE PREFERRED EMBODIMENTS

Figure 2:
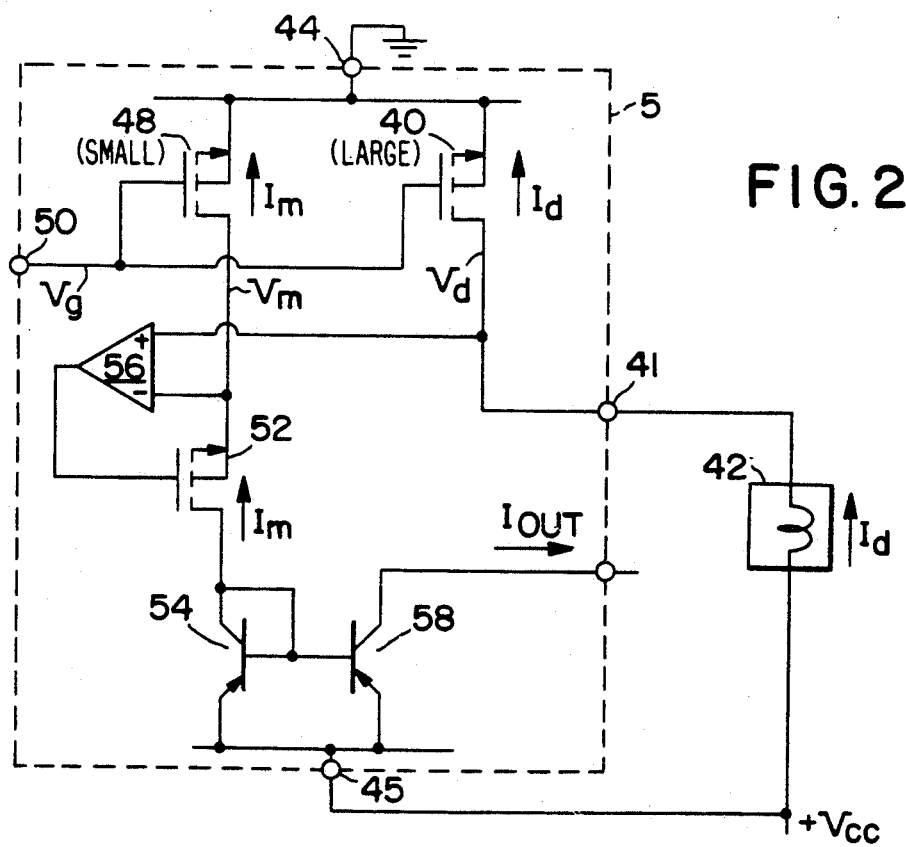
FIG. 2 shows a preferred embodiment of the load-current monitor circuit and a MOS power transistor of this invention.

Referring to FIG. 2, a silicon integrated circuit chip 5 includes a large area MOS power or driver transistor 40 that is connected in series via chip terminal 41 with the external load 42 forming a circuit branch that is connected between a circuit ground point 44 and a voltage supply terminal 45 of the integrated circuit chip 5. A much smaller area MOS monitor transistor 48, having been made in the chip 5 simultaneously and by the same process steps used for making the large driver transistor 40, has the same channel-polarity and the same threshold voltage as does the driver transistor 40.

The sources of the driver transistor 40 and the monitor transistor 48 are both connected to the circuit ground point 44 and the gates of the driver and monitor transistors are both connected to the driver input, namely the driver control-voltage terminal 50. Current Im through the monitor transistor 48 flows to the voltage supply point 45 through a MOS transistor 52 and a PNP transistor 54. A differential amplifier 56 serves as a voltage comparator having one input connected to the drain of the driver transistor 40 and the other input connected to the drain of the monitor transistor 48. The output of the amplifier 56 is connected to the gate of the transistor 52 so as to force the drain voltage Vms of the monitor transistor 48 to be equal to the drain voltage Vds of the driver transistor 40.

Figure 1:
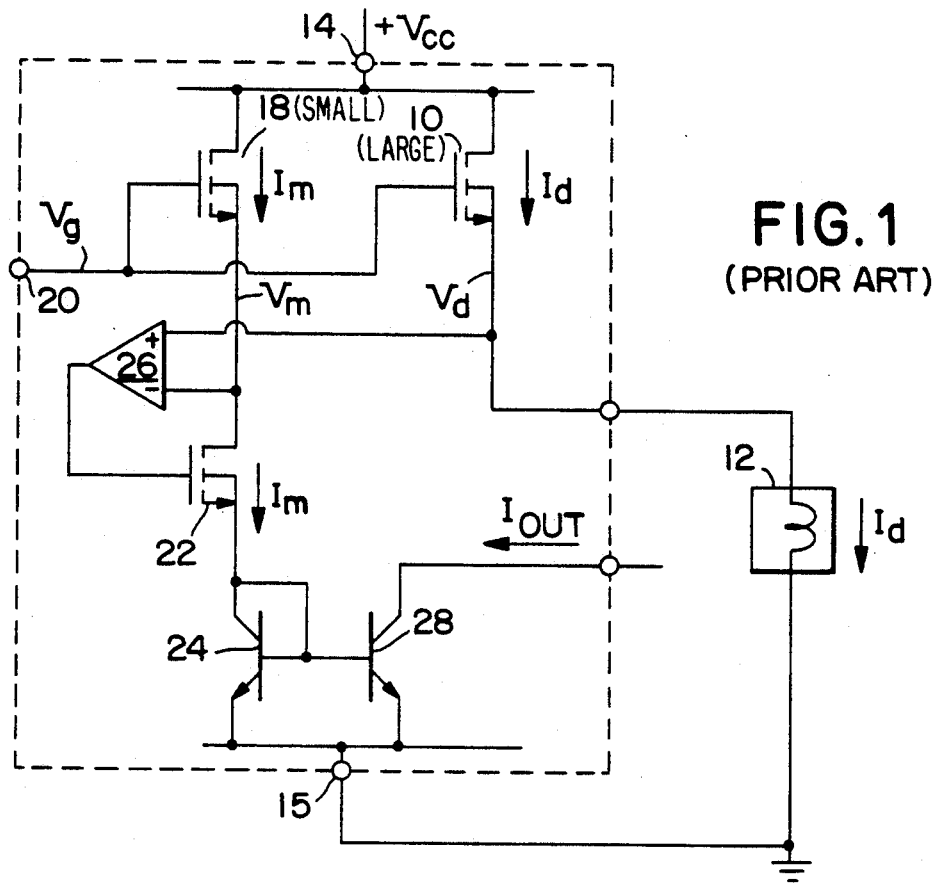
FIG. 1 shows a load-current monitor circuit and a MOS power transistor of the prior art.

For both of the circuits shown in FIGS. 1 and 2, the relatively small monitor current Im will be nearly proportional to the large load current even without the voltage-forcing means (differential amplifier 26/56 and MOS transistor 22/52), attributable to the fact that the characteristics of the simultaneously-made driver and monitor transistors are very nearly the same. The voltage-forcing means is in both cases for forcing the source/drain voltages to be exactly equal, to overcome errors due to second-order differences in driver and monitor transistor characteristics. The voltage-forcing means in both circuits is for improving the accuracy of that proportionality between load and monitor currents. The monitor output current Iout from the collector of the current mirror transistor 58 is of cource proportional to the monitor current Im.

The following current equations demonstrate the effect of amplifier (26) offset in the prior art circuit of FIG. 1:

(1) $Id = gm_d(Vg - V_T)^2(1 + \lambda Vds)$ (2) $Im = gm_m(Vg + Vos - V_T)^2(1 + \lambda Vds)$ (3) $\Delta Im = 2gm_m(1 + \lambda Vds)(Vg + Vos - V_t)Vos$ where
  $gm_d$ is the transconductance of the MOS driver transistor,
  $gm_m$ is the transconductance of the MOS monitor transistor,
  $\lambda$ is the standard symbol representing the characteristic slope in the source-drain voltage-versus-current curve for the MOS driver and monitor transistors operated in saturation (having typical values of 0.03 to 0.005),
  Vds is the voltage across the MOS transistors (10 and 18) drain-to-source.
  Vg is the MOS transistors (input voltage) gate voltage,
  $V_T$ is the threshold voltage of the MOS driver and monitor transistors, and
  Vos is the differential amplifier (output) offset voltage.

Equation (3) is the difference between the currents Id and Im, assuming that they have the same scale, and represents the "error current" reflecting the effect of amplifier offset voltage.

Referring to FIG. 2, the following current equations reveal the greatly reduced effect of amplifier (56) offset provided by the load-current monitor circuit of this invention.

(4) $Id = gm_d(Vg - V_T)^2(1 + \lambda Vds)$ (5) $Im = gm_m(Vg - V_T)^2[1 + \lambda(Vds + Vos)]$ (6) $\lambda Im = gm_m(Vg-V_T)^2 \lambda Vos$ where equation (6) is the difference between the currents Id and Im, assuming that they have ths same scale.

In equation (3), the difference-monitor current (ΔIm) is a function of the sum of the gate voltage Vg and the amplifier offset voltage Vos. The corresponding equation (6) representing the circuit of this inention has no such offset voltage term Vos summed with the gate voltage term, but in the prior art circuit of FIG. 1 the "error current" ΔIm of equation (2) will change increasingly rapidly as gate voltage Vg, Id and Im decrease. When the driver current Id in the prior art circuit goes to zero, the effect of the offset voltage Vos of the differential amplifier 26 becomes more prominent, and for zero monitor current Im, there remains a residual driver current Id.

On the other hand, in the circuit of this invention shown in FIG. 2, there is no such effect and the ratio of currents Id to Im is seen to remain constant as a function of gate voltage. In fact, as (Vg−Vt) goes to zero, corresponding to zero driver current Id, the "error current" caused by the offset Vos of the differential amplifier 56 also goes to zero (equation 6).

Figure 3:
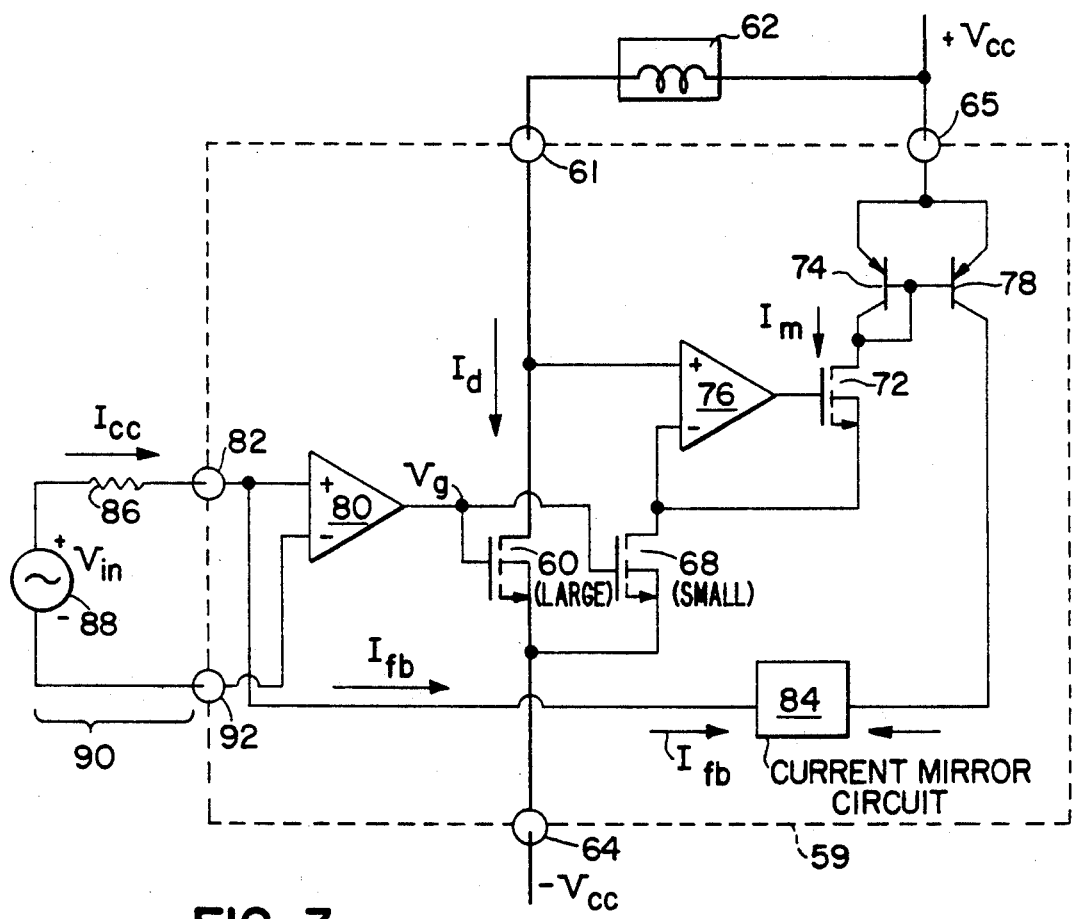
FIG. 3 shows an integrated circuit servo amplifier of this invention having a control-current input.

Referring to FIG. 3, an integrated circuit 59 incorporates all of the elements contained in the integrated circuit 5 of FIG. 2 which are identified by new numerals, namely the FIG. 2 numerals plus 30. Additional components include a differential control-voltage amplifier 80 that has an output connected to the gates of the MOS driver transistor 60 and the MOS current-monitor transistor 68. One input of the amplifier 80 is connected to an input-signal reference contact pad 92, and the other input of amplifier 80 is connected to an input control-current pad 82. An external discrete resistor 86 is connected in series with a control-voltage source 88. This external series circuit 90 is connected to the contact pads 82 and 92, the input-control current and input-signal reference contactpads, respectively. In some situations, the input-signal reference contact pad 92 and the negative supply terminal 64 are the same pad.

A current mirror circuit 84 is connected in tandem with the current mirror comprised of transistors 74 and 78, to form a compound current mirror circuit with output connected to the input control-current pad 82 and to produce a feedback current Ifb there which is essentially equal to and has the same polarity as the externally generated input control current Icc. From another point of view, an increase in the input control voltage Vin causes an increase in Id, Im, and Ifb. The input impedance of the amplifier 80 and the output impedance of the current mirror circuit 84 are inherently very high impedances, e.g. tens of megohms, and are at least 100 times higher than the resistance (preferably less than 100,000 ohms) of the external resistor 86. The feedback current Ifb causes a voltage drop across the external resistor 86 that equals the increase in Vin and keeps the input voltage of the differential control-voltage amplifier 80 at essentially zero. Thus Ifb is equal to Icc and the combination of the integrated circuit 59 with its load 62 performs as a current amplifier with gain Id/Icc.

What is claimed is:

1. A load-current monitor circuit for a MOS driver transistor comprising a MOS driver transistor and a substantially smaller MOS monitor transistor, said MOS transistors having been simultaneously formed, and having the same channel-polarity and essentially the same threshold voltage, said MOS transistors having their gates connected together and having their sources connected together; and a voltage-forcing circuit means having an input connected to the drain of said MOS driver transistor and having an output connected to the drain of said MOS monitor transistor, for forcing the drain voltage of said monitor transistor to be equal to the drain voltage of said driver transistor.

2. An integrated circuit having formed therein a MOS-transistor load-current monitor circuit comprising:
  a) a MOS driver transistor;
  b) a substantially smaller MOS monitor transistor having the same channel polarity and essentially the same threshold voltage as does said MOS driver transistor, said MOS transistors having been simultaneously formed;
  c) a first and second integrated-circuit signal-ground contact pads across which an integrated-circuit energizing voltage may be applied, the sources of said driver and monitor transistors being connected to a first of said signal-ground contact pads;
  d) a driver control-voltage conductor to which the gates of said driver and monitor transistors are connected, so that the levels of the currents through said driver and monitor transistors are proportional to a control voltage that may be applied to said control-voltage conductor;
  e) a voltage-forcing circuit means connected separately to the drain of said MOS driver transistor and the drain of said MOS monitor transistor, for forcing the drain voltage of said monitor transistor to be equal to the drain voltage of said driver transistor, so that the current through said monitor transistor remains proportional to the current through said driver transistor down to near zero driver-current levels.

3. The integrated circuit of claim 2 wherein said MOS driver transistor and said MOS monitor transistor are N-channel transistors having been simultaneously formed in said integrated circuit and wherein said first and second signal-ground-contact-pads are for being connected to an external source of DC voltage with said first signal-ground contact-pad being at a more negative DC voltage than said second signal-ground contact-pad.

4. The integrated circuit of claim 2 additionally comprising a current-mirror means connected to said monitor transistor for generating a feed-back current that is proportional to the current through said monitor transistor.

5. The integrated circuit of claim 4 additionally comprising an integrated-circuit load-contact pad connected to said drain of said MOS driver transistor, so that an external load may be connected between said load contact-pad and said second signal-ground contact pad.

6. The integrated circuit of claim 4 additionally comprising an integrated-circuit input control-current pad, an input-signal reference contact-pad and a differential-voltage amplifier, said differential-voltage amplifier having one input connected to said input-signal reference contact-pad, having the other input connected to said input control-current contact-pad, and having an output connected to said driver control-voltage conductor; the output of said current-mirror means connected to said other input of said differential-voltage amplifier.

7. The integrated circuit of claim 6 wherein said current-mirror means is additionally for generating said proportional current of such polarity that when an external circuit, having a resistor connected in series with a control-voltage source, is connected between said input control-current contact-pad and said input-signal reference contact-pad, an increase in the amplitude of a control-current that may be introduced from the external circuit into said input control-current pad will result in a commensurate increase in the amplitude of the output current of said current-mirror means to maintain the voltage at said input control-current contact-pad at about zero voltage relative to said input-signal reference contact pad.

8. The integrated circuit of claim 4 wherein said voltage-forcing circuit means is comprised of a differential voltage-comparator amplifier having one and another inputs respectively connected to said drains of said driver and monitor transistors, a third transistor connected between said drain of said monitor transistor and said first signal-ground contact pad, the output of said differential voltage-comparator amplifier connected to the signal input element of said third transistor.

* * * * *